(12) United States Patent
Müller et al.

(10) Patent No.: US 10,050,358 B2
(45) Date of Patent: Aug. 14, 2018

(54) POWER CONTACTING DEVICE (71) Applicant: Leukert GmbH, Kaufbeuren-Neugablonz (DE)

(72) Inventors: Matthias Müller, Kaufbeuren-Neugablonz (DE); Rudi Heinz Kolb, Füssen im Allgäu (DE)

(73) Assignee: Leukert GmbH, Kaufbeuren-Neugablonz (DE)

( * ) Notice: Subject to any disclaimer, the term of this patent is extended or adjusted under 35 U.S.C. 154(b) by 0 days.

(21) Appl. No.: 14/436,681

(22) PCT Filed: Nov. 13, 2014

(86) PCT No.: PCT/EP2014/074504
§ 371 (c)(1),
(2) Date: Apr. 17, 2015

(87) PCT Pub. No.: WO2016/074729
PCT Pub. Date: May 19, 2016

(65) Prior Publication Data
US 2017/0244182 A1    Aug. 24, 2017

(51) Int. Cl.
*H01R 11/11* (2006.01)
*H01R 12/52* (2011.01)
*H01R 13/11* (2006.01)
*H05K 1/14* (2006.01)
*H05K 1/02* (2006.01)

(52) U.S. Cl.
CPC .......... *H01R 12/523* (2013.01); *H01R 13/111* (2013.01); *H05K 1/0263* (2013.01); *H05K 1/144* (2013.01); *H05K 2201/10303* (2013.01); *H05K 2201/10401* (2013.01)

(58) Field of Classification Search
CPC ........ H01R 13/20; H01R 13/11; H01R 13/28; H01R 11/22; H01R 4/34; H01T 13/04
USPC ................................. 439/288, 860, 855, 883
See application file for complete search history.

(56) References Cited

U.S. PATENT DOCUMENTS 2,756,485 A    7/1956 Abramson et al.
4,983,133 A *  1/1991 Van Scyoc ............. H01R 11/12
                                                             439/860

(Continued)

FOREIGN PATENT DOCUMENTS

DE    4006078 A1    8/1991
DE    1379113 A2    1/2004

(Continued)

*Primary Examiner* — Hien Vu
(74) *Attorney, Agent, or Firm* — Brinks Gilson & Lione (57) ABSTRACT

A power contacting device includes a contact pin (1) and at least one contact pin receptacle (2) penetrated by the contact pin in the operating state. To provide a power contact which permanently ensures high-quality contacting, even when the contacted components move relative to one another, the contact pin receptacle (2) has a first guide arrangement (3) which is fixed to a component in the operating state and a second guide arrangement (4) which is conductively connected to the first guide arrangement, the second guide arrangement (4) being arranged displaceably on the first guide arrangement (3) and the contact pin (1) conductively contacting at least the second guide arrangement (4) in the operating state.

19 Claims, 4 Drawing Sheets

(56) References Cited

U.S. PATENT DOCUMENTS

| | | | | |
|---|---|---|---|---|
| 5,529,509 A | * | 6/1996 | Hayes | H01R 11/12 |
| | | | | 439/288 |
| 5,577,927 A | * | 11/1996 | Okada | H01R 4/34 |
| | | | | 439/287 |
| 5,834,696 A | * | 11/1998 | Kurosawa | H01R 13/213 |
| | | | | 174/84 C |
| 6,520,812 B1 | * | 2/2003 | Machado | H01R 11/282 |
| | | | | 439/855 |
| 7,125,295 B2 | * | 10/2006 | Zhao | H01R 11/12 |
| | | | | 439/287 |
| 2008/0144301 A1 | * | 6/2008 | Konishi | H01R 12/58 |
| | | | | 361/803 |

FOREIGN PATENT DOCUMENTS

| | | | |
|---|---|---|---|
| FR | 2565425 | A1 | 12/1985 |
| FR | 2906436 | A1 | 3/2008 |

\* cited by examiner

POWER CONTACTING DEVICE

TECHNICAL FIELD

The present invention relates to a power contacting device, inter alia for printed circuit boards.

In the power contacting domain of, in particular, interconnected printed circuit boards or printed circuit board stacks or conductor rails or other components conducting higher currents, currents often arise which are sometimes significantly above 100 A, printed circuit boards or conductor rails of this type being used for example in electric motors, batteries, accumulators or generally in the connection of power consumers and sources of electrical energy. In the electromobility domain, very high charging currents are required which demand appropriately configured power contacts suitable for everyday use.

BACKGROUND

Known power contacting devices of, in particular, printed circuit boards or printed circuit board stacks between, for example, accumulators and power consumers habitually have contact pins which penetrate the printed circuit boards in the operating state, each of the contact pins being guided in a receptacle in the printed circuit board. This receptacle is often provided with a resilient ring or more generally with resilient contacts for the permanent and secure contacting of the contact pin. Contact pins of this type are usually made of metal and are round in cross section.

For components in which the printed circuit boards or printed circuit board stacks move relative to one another in the operating state, for example due to varying degrees of heating, the secure contacting between the contact pin and component can no longer be ensured for every operating state. For example, the printed circuit boards can move so that the spring contacts of the receptacles no longer rest fully on the contact pin.

SUMMARY OF THE INVENTION

It is therefore the object of the invention to provide a power contact which permanently ensures a high-quality contacting even when the contacted components move relative to the contact pin.

This object is achieved with a power contacting device comprising a contact pin and at least one contact pin receptacle penetrated by the contact pin in the operating state, in that the contact pin receptacle has a first guide arrangement fixed to a component in the operating state and a second guide arrangement conductively connected to the first guide arrangement, the second guide arrangement being arranged displaceably on the first guide arrangement and the contact pin conductively contacting at least the second guide arrangement in the operating state.

The displaceability according to the invention of the two guide parts relative to one another very advantageously allows a wobbling of the longitudinal axis of the contact pin penetrating at least one, preferably both the guide arrangement, as caused by components moving relative to the contact pin. The provision according to the invention of intrinsically making the guide arrangement movable also very advantageously allows a movement of the contact pin inside the guide arrangement or allows a movement of the guide arrangement relative to the contact pin, which can then follow this movement without a loss of contact. The invention very advantageously selects the mechanically simple solution of a displaceability of two parts relative to one another instead of more complex solutions which require a cardanic suspension or the like. In this respect, it is preferred that the second guide arrangement is guided on, particularly in, the first guide arrangement and is held thereby.

An embodiment of the invention provides that the first and second guide arrangement each have a central opening which is respectively penetrated by the contact pin in the operating state. According to the invention, "central openings" is also understood as meaning openings which are not located in the geometric centre of a guide arrangement, i.e. also eccentric openings. "Openings" within the meaning of the invention are in any case passage openings which can also have a round, angular or polygonal passage surface. Both openings are penetrated by the contact pin and are therefore spaced apart from one another, when viewed along the longitudinal axis of the contact pin. Thus, the two openings are positioned coaxially to one another viewed only in the direction of the longitudinal axis of the contact pin, and they can differ therefrom in any direction in the reference system of the component.

It is provided according to the invention that the first and second guide arrangement have mutually corresponding engagement means. This measure ensures that the two guide arrangement are guided securely on one another and are thus always capable of transmitting the current entering the second guide arrangement from the contact pin to the first guide arrangement and to the component or vice versa. It is therefore an important feature of the invention to not only passively receive the second guide arrangement in a cavity in the first guide arrangement, but to match them physically to one another and to provide them with mutually coordinated and mutually interacting engagement means.

A development of the invention provides that the engagement means of the first guide arrangement are configured as one or more, in particular three, radially outer openings, preferably openings which are spaced apart equally over the circumference, and/or are configured as beads in the region between the radially outer openings, and/or are configured as wrap-arounds. The first-mentioned configuration provides a constructively simple engagement means due to the provision of simple cavities in the main surface of the first guide arrangement which can simply be produced by stamping, for example. These openings, of which at least one, but also two, three, four, five or more can be provided, can be penetrated, engaged around or contacted in another way by corresponding engagement means of the second guide arrangement. A person skilled in the art will select the number and orientation of openings which ensures a satisfactory mobility simultaneously with a continuing adequate contact surface between the first and second guide arrangement. The circumferential equal spacing and thereby the symmetrical arrangement advantageously allows a flat contacting which is equally good at all circumferential points of the guide arrangement, i.e. enough contact surfaces are available over the circumference for the second guide arrangement in the entire surface of the first guide arrangement. The additional or alternative configuration of the engagement means as beads provided in the region between the radially outer openings allows an even better contact between the first and second guide arrangement, because in this way a form-locking contacting is allowed in addition to a flat contacting. The additional or alternative configuration of the engagement means as wrap-arounds provides a further form-locking connection option between the first and second guide arrangement in that the wrap-arounds engage around correspondingly shaped parts of the second guide arrangement. Thus, according to the invention the engagement means have to lock together positively and/or non-positively so that they allow a movement of the two guide arrangement relative to one another within particular limits, in particular a relative movement displaceable in two directions, i.e. in one plane. Furthermore, in this respect, they allow a contact surface which is large enough for current conduction.

An embodiment of the invention provides that the first guide arrangement is configured as a circular disc with an edge angled with respect to the plane of the disc, in particular is configured with a plurality of fastening tabs which are predominantly directed radially outwards from the edge and are oriented predominantly in parallel with the plane of the circular disc. A disc of this type is easily produced as a stamped part and, due to its round circumference, does not have any sharp corners or edges which, on the one hand, basically present a relatively high risk of injury and are also disadvantageous for current conduction. Bending the edge round, for example by deep drawing, produces an accommodation space for the second guide arrangement which space basically allows the mobility of the means. The radially outwardly directed fastening tabs are used to fasten or fix the first guide arrangement to a component, for example to a printed circuit board or the like. This fixing procedure can be carried out, according to the invention, for example by reflow soldering, i.e. while passing a printed circuit board through a soldering furnace. As a result, the guide arrangement according to the invention can also be demoulded again, i.e. it can be separated from the printed circuit board, which simplifies later recycling of worn-out printed circuit boards. Due to the parallelism of the plane spanned by the fastening tabs and the plane of the circular disc, an approximately cylindrical disc-shaped cavity is advantageously produced between the printed circuit board and first guide arrangement, in which the second guide arrangement is received such that it can move and which always provides adequate room for movement even when the two guide arrangement expand due to temperature. Although in principle a predominantly round configuration of the first guide arrangement is preferred, it can also be configured in other geometric shapes, for example as a polygon.

With regard to the second guide arrangement, the invention proposes that this means has a plurality of spring contact arms which are directed towards a centre of the central opening and that the central opening is smaller than the central opening in the first guide arrangement. This advantageously ensures that the spring contact arms fully contact a contact pin which penetrates the second central opening, and the second guide arrangement, having a contacted contact pin in its central opening, can perform a movement inside the larger first central opening in the first guide arrangement. In this respect, the spring contact arms can and are to point beyond the plane of the main surface of the second guide arrangement and point through the central opening in the first guide arrangement in the operating state, thus they penetrate this opening like the contact pin. This forms a further engagement means.

With regard to the second guide arrangement, it is further provided according to the invention that the engagement means thereof are configured as engagement lugs corresponding in number and form to the number of radially outer openings in the first guide arrangement, in particular on the radially outer edge of the second guide arrangement and/or are configured as beads which are formed and arranged correspondingly for engagement in the beads of the first guide arrangement and/or are configured as spring elements, it being possible for the engagement lugs to also be configured, or they are configured, as spring elements. The engagement lugs are preferably configured as webs, the course of which has an approximately constant radius, and they are thus oriented as to extend circumferentially with respect to the circular disc of the second guide arrangement and thereby provide a movement path along the longitudinal extent thereof. Due to the arrangement, in a recess, of the engagement lugs on the edge of the main surface of the second guide arrangement, the lugs are spaced apart from one another at a maximum distance and thereby ensure the best possible contacting of the two guide arrangement since they cover the entire superficial extent of the second guide arrangement. The provision according to the invention of beads which are formed and arranged correspondingly for engagement in the beads of the first guide arrangement allows a further form-locking connection between the guide arrangement and thereby allows an even more secure contacting. The invention also provides configuring the beads of the first guide arrangement for engagement through the engagement lugs of the second guide arrangement. In addition or alternatively, if the engagement elements are configured as spring elements, they can be received in correspondingly formed receptacles in the first guide arrangement where they can also be retained in a force-locking manner. In this case as well, the spring elements are arranged in the edge regions of the second guide arrangement to cover the largest possible main surface.

An embodiment of the invention provides that the engagement lugs form a wrap-around for the regions of the first guide arrangement and in so doing pass through the radially outer openings. In this respect, the invention understands "wrap-around" as meaning a preferably predominantly parallel spacing from the circular plane of the second guide arrangement to the plane spanned by the engagement lug. In other words, the engagement lugs start in the plane of the circular disc and then run at an angle thereto until they have reached an adequate distance in order to receive the wall thickness of the circular disc of the first guide arrangement between themselves and the plane of the circular disc of the second guide arrangement. As soon as this distance has been reached, the engagement lugs again run in a plane parallel to the plane of the circular disc of the second guide arrangement.

As already stated, it is provided according to the invention that the second guide arrangement is configured as a circular disc, in particular as a radially shorter circular disc compared to the first guide arrangement, in particular a thickness of the circular disc being less than a height of the angled edge of the first guide arrangement. The invention understands "radially shorter" as meaning that the second circular disc has a smaller radius than the first circular disc, i.e. it is also superficially smaller. Since the bent-over edge of the first guide arrangement is greater than the thickness of the circular disc of the second guide arrangement, the second guide arrangement can be easily moved in the space spanned thus.

As already mentioned, according to the invention, the first and second guide arrangement can also be configured as predominantly rectangular plates. The shape of the two guide arrangement merely have to be coordinated with one another so that the functionality is retained, i.e. the second guide arrangement is displaceable relative to the first guide arrangement and is guided thereon, or in other words they are guided by each other.

Finally, it is provided that the second guide arrangement has a horizontally displaceable mobility in the first guide arrangement, the maximum deflections of the second guide arrangement corresponding to a radial length difference of the radial extent of the outer openings and a radial width of the engagement lugs. In other words, the maximum deflection of the second guide arrangement to the first guide arrangement is established by the geometric relationships of the two guide arrangement to one another, in particular by length differences. This displaceability allows a wobbling of the contact pin passing through the two guide arrangement and thereby provides the contact pin with adequate degrees of freedom of motion to compensate for the change in position of the contacted components.

The invention is described by way of example in a preferred embodiment with reference to drawings and further advantageous details can be seen in the figures of the drawings.

Functionally identical parts have therefore been provided with the same reference numerals.

DETAILED DESCRIPTION OF THE DRAWINGS

Figure 1:
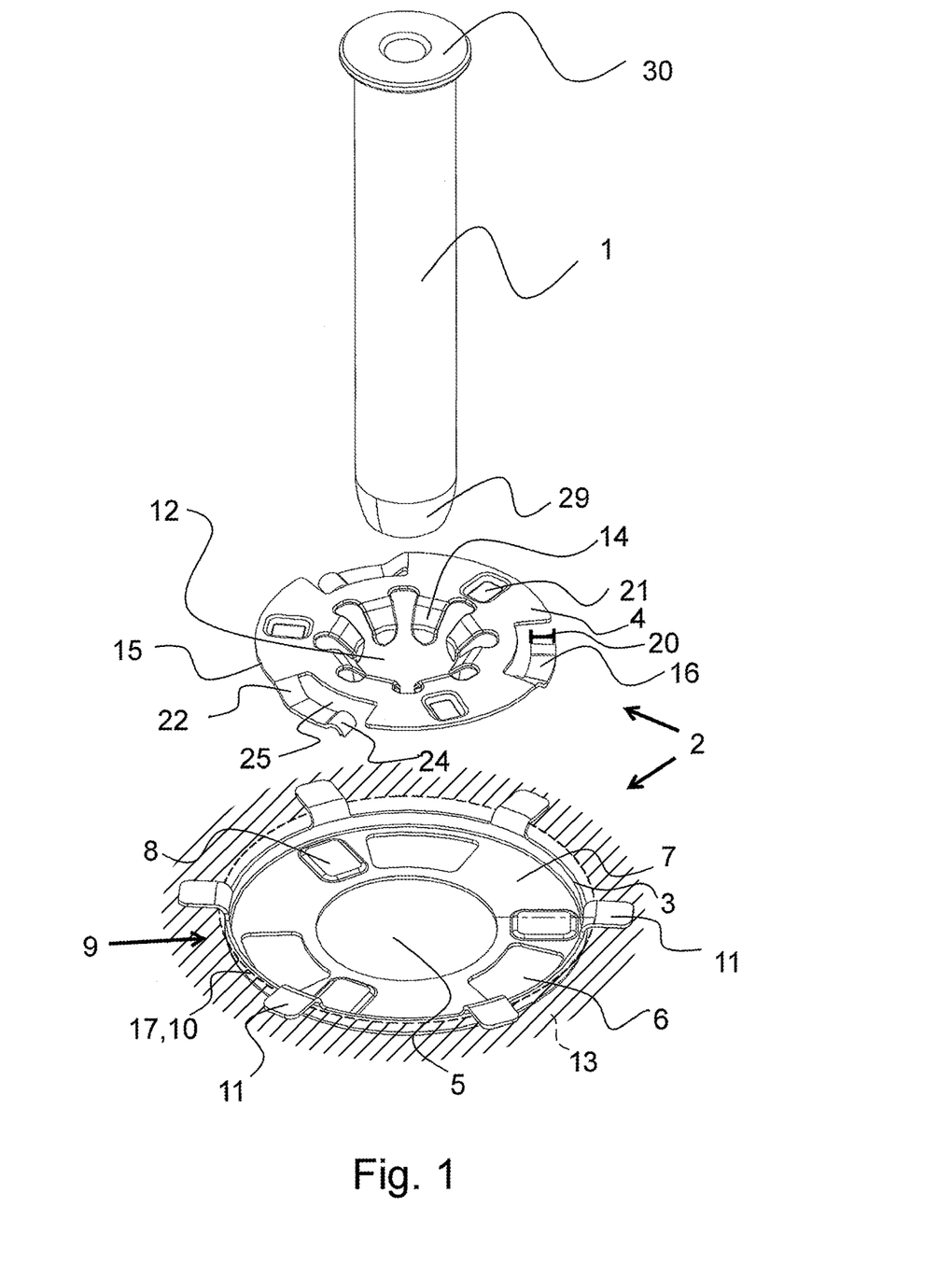
FIG. 1: is a perspective view of a first embodiment.

FIG. 1 is a perspective view of a contact pin 1, a second guide arrangement 4 and a first guide arrangement 3 which together form a contact pin receptacle 2.

The contact pin 1 is an elongate rotationally symmetrical part comprising a lead-in bevel 29 and a pressure surface 30 which is arranged opposite thereto. In the installed position, the contact pin is electrically contacted by a conductor and has an adequate cross-sectional surface for conducting high currents.

Shown under the contact pin 1 is the second guide arrangement 4 which, in this embodiment, is configured as an approximately circular disc-shaped body having a central opening 12. In the installed position, the contact pin 1 passes through this opening 12 and its lateral surface is contacted under spring force by the spring contact arms 14. At their free ends, these spring contact arms 14 are directed approximately towards the centre point of the central opening 12 and thus define between them a circle 31 (FIG. 2) through which the contact pin 1 passes in the installed position. Since this circle 31 has a smaller diameter than the diameter of the contact pin 1 and the spring contact arms 14 project out of the plane of the second guide arrangement 4 at an angle, a spring force is produced towards the lateral surface of the contact pin 1, and resilient contact is made possible. The spring contact arms 14 can be produced from a different material from the rest of the body of the second guide arrangement 4, for example to provide a better flexural strength, a greater spring force or the like. According to the invention, they can also consist of the same material. The figure also shows three beads 21 which are arranged at the same angular distance from one another and are oriented towards the first guide arrangement 3 and also, inbetween the beads, three engagement lugs 16 which are also arranged at the same angular distance from one another and each project into a recess 25. The radial width 20 of the engagement lugs 16 is smaller than that of the recess 25. These engagement lugs 16 are used to engage around the first guide arrangement 3. They emanate in the region of the radially outer edge 15 in the plane defined by the cylindrical disc of the second guide arrangement 4 and extend in the circumferential direction. They have a portion 22 which is inclined with respect to the plane and merges into a portion 23 which is parallel to the plane. Each engagement lug 16 ends in a portion 24 bent away from the plane, the summit of the curve being located between the plane of the second guide arrangement 4 and the plane in which the parallel portions 23 of all the engagement lugs 16 are located. This produces a sort of spring which ensures close contact between the first and the second guide arrangement 3, 4. The second guide arrangement 4 is produced from metal as a stamped bent part.

The first guide arrangement 3 is shown underneath. The three components of FIG. 1 are thus shown in the arrangement in which they are subsequently assembled in one another. The guide arrangement 3, like the second guide arrangement 4 has a circular disc 9 as the main surface, the circular disc 9 having a first central opening 5, the diameter of which is greater than that of the second central opening 12 in the second guide arrangement 4. Three openings 6 which are arranged equidistantly from one another at the same angular spacing are provided in a radially outer region. Arranged in the regions 7 between these radially outer openings 6 are beads 8 which are slightly larger than the beads 21 of the second guide arrangement 4. Here, both types of beads 8, 21 point in opposite directions, but they can also point in the same direction, so that, in the assembled state, the beads 21 of the second guide arrangement 4 project into the beads 8 of the first guide arrangement 3 and thus both guide arrangement rest against one another positively in the region of the beads 8, 21. At the same time, the contact surface of the two guide arrangement 3, 4 is thus increased compared to a bead-free state. However, a different embodiment is shown in which the beads 8 of the first guide arrangement 3 are specifically formed opposing the beads 21 of the second guide arrangement 4. Since they are thus open downwards, they thereby form an accommodation space for the upwardly bent portions 24 of the engagement lugs 16 and also produce a positive locking. This orientation simultaneously forms a further stop, since the edges of the beads 21 of the second guide arrangement 4 meet the edges of the beads 8 of the first guide arrangement 4 when the second guide arrangement 4 performs a rotational movement relative to the first guide arrangement. Since the diameter of the first guide arrangement 3 is greater than that of the second guide arrangement 4, the second guide arrangement can move in an arbitrarily horizontal manner in two directions relative to the first guide arrangement 3 without passing out of the overlaid surface thereof. In particular, the second guide arrangement 4 can be displaced along the radial extent 19 of the radially outer openings 6 which simultaneously also form two stops for the second guide arrangement 4 and thereby restrict the maximum mobility thereof. Since the engagement lugs 16 extend around the circumference of the circle, the second guide arrangement 4 can also perform a rotational movement relative to the first guide arrangement 3 without the engagement lugs 16 becoming disengaged. The angle available for this is restricted by the circumferential length of the engagement lugs 16. In other words, it is restricted on one side by the inclined portion 22 which meets the edge of the radially outer opening 6. The first guide arrangement 3 has fastening tabs 11 which are arranged equidistantly around the circumference of the edge 10 and point radially outwards. The height of the edge 10, together with the width of the circular disc 9, defines the space in which the second guide arrangement 4 can move in a displaceable manner.

Figure 2:
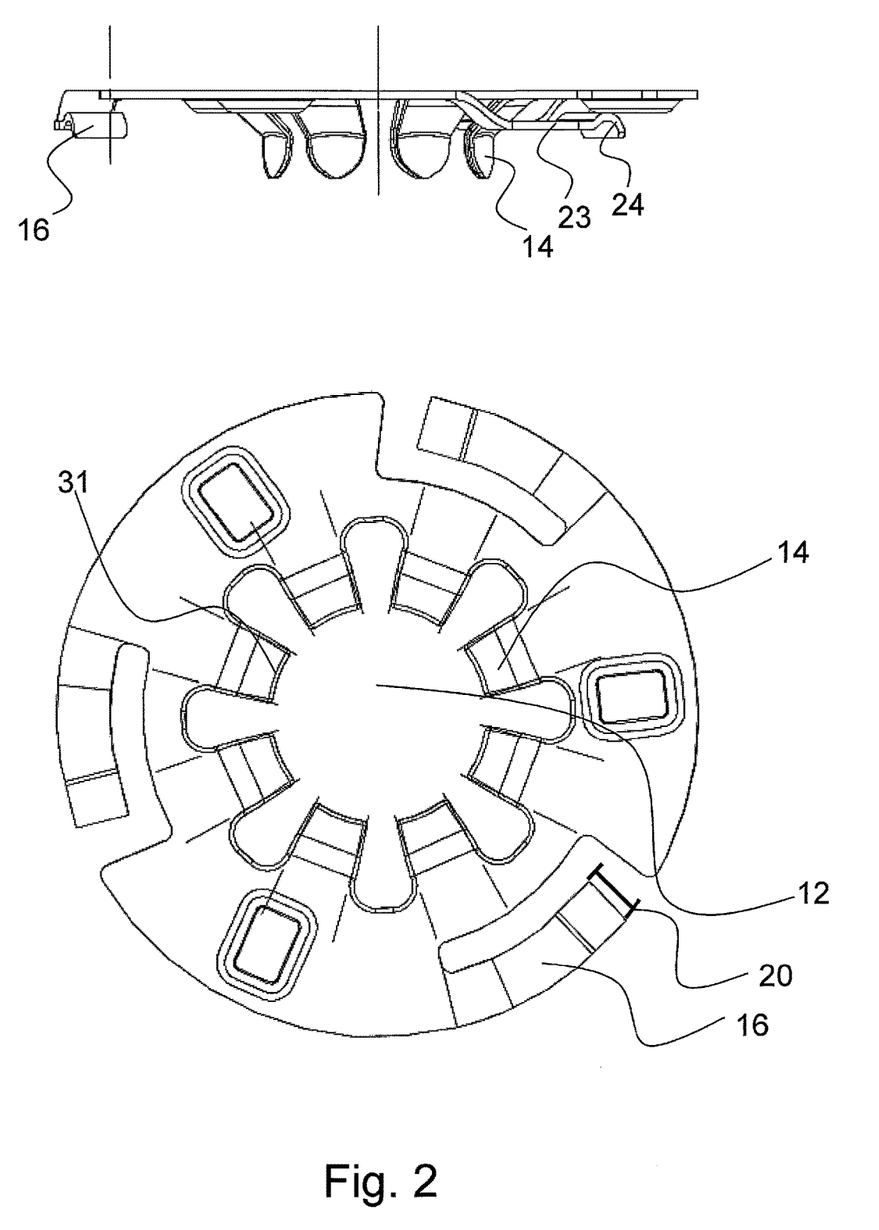
FIG. 2: is a detail view of the second guide arrangement of this embodiment.

FIG. 2 shows the vertical extent of the second guide arrangement 4 in a side view and in a plan view. The ends of the spring contact arms 14 project out of the plane of the main surface and, in a plan view, are directed towards the centre point of the second central opening 12. As already stated, by their ends they define a circle 31 which has a smaller diameter than the contact pin 1. The plan view also shows the radial width 20 of the engagement lugs 16. The side view shows the parallelism and spacing between the plane of the circular disc and the parallel portions 23. It can also be clearly seen that the summit of the outwardly curved portion 24 is located relatively closely to the plane of the circular disc and thereby also produces a spring contact. By passing out of the plane of the circular disc, the spring contact arms 14 pass through the central opening 5 in the first guide arrangement 3 in the operating state of the invention and thereby form a further engagement element.

Figure 3:
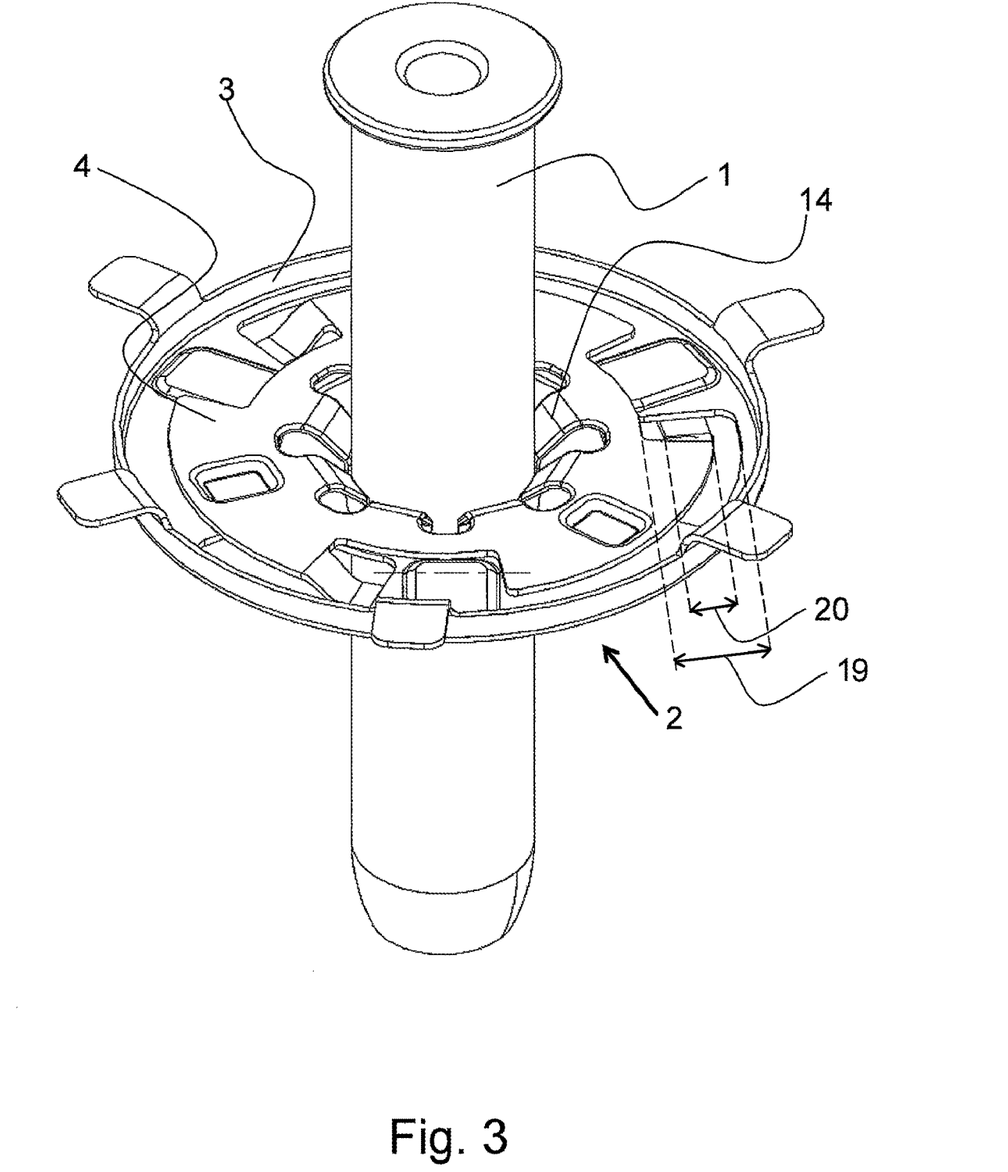
FIG. 3: is a perspective view of the embodiment in the installed position.

FIG. 3 is a perspective view of the embodiment in the installed position. The contact pin 1 passes through the second central opening 12 in the second guide arrangement 4 and is contacted in a planar manner on its lateral surface by the spring contact arms 14 of the second guide arrangement under spring force. According to the invention, a contact pin 1 can also pass through more than two contact pin receptacles 2, for example three, four or more if it is long enough and if the correspondingly stacked components allow this as a result of their geometry. The basic principle of the cooperation according to the invention of the two guide arrangement 3, 4 is shown in FIG. 3: the first guide arrangement 3 defines, by its greater diameter and by the height of the edge 10, the maximum movement space of the second guide arrangement 4 arranged thereon or therein. Although the embodiment shown of the first guide arrangement 3 is a circular disc in a plan view, other geometric shapes of the first guide arrangement 3 are also possible, in particular ovals, polygons such as triangles, quadrilaterals, pentagons, hexagons or greater polygons such as the dodecagon which is not to be considered as exclusive. The second guide arrangement 4 is arranged displaceably inside this first guide arrangement 3 fixed spatially to the component. The maximum deflections of the second guide arrangement corresponding to a radial length difference of the radial extent 19 of the outer openings and the radial width 20 of the engagement lugs 16. The second guide arrangement also has a central opening 12 which is arranged in the region of, particularly inside, the first central opening 5. Since the diameter of the second central opening 12 is smaller than the diameter of the first central opening 5, the second central opening 12 can perform a movement within particular limits without leaving the surface of the first central opening 5. Or more precisely, in the plan view of both openings 5, 12, without the peripheral line of the second central opening 12 intersecting the peripheral line of the first central opening 5. This arrangement very advantageously allows a movement of the contact pin 1 and contact pin receptacle 2 relative to one another, for example a wobbling of the contact pin 1. Since, in the operating position, both the contact pin 1 and the first guide arrangement 3 are each fixed to a component, although it is a different component, the provision of a second guide arrangement 4, active between contact pin 1 and first guide arrangement 3, allows a movement of the two fixed parts relative to one another, in that the second guide arrangement 4 changes its position relative to the first guide arrangement 3 without losing contact with the contact pin 1.

Thus, the spring contact arms 14, contacting the contact pin 1, of the second guide arrangement 4 remain free of force and thus unaffected when the position of the contact pin 1 changes with respect to first guide arrangement 3.

The invention thus separates the functions of contacting the contact pin 1 and guiding it in the contact pin receptacle 2 into two components. The electrical contact between the first guide arrangement 3 and second guide arrangement 4 is produced by the flat positioning of one on the other, thus overall from the contact pin 1 via the spring contact arms 14 of the second guide arrangement 4 to the surface of the first guide arrangement 3, in particular to the regions 7 between the radially outer openings 6 in the first guide arrangement 3, and finally via the fastening tabs 11 into the component 13, for example a printed circuit board or a conductor rail, indicated in FIG. 1 by broken lines.

The second guide arrangement 4 is thus guided on the first guide arrangement 3 and can perform a movement relative thereto which can have both a radial component and a component oriented along the circumference of the circle. This allows a wobbling of the contact pin 1 passing through both guide arrangement 3, 4 in the operating state. Consequently, the contact pin always remains in contact with the spring contact arms 14 of the second guide arrangement 4 and, in turn, the second guide arrangement always remains in superficial contact with the first guide arrangement 3 which, for its part, is in turn always in contact with the component 13.

Figure 4A:
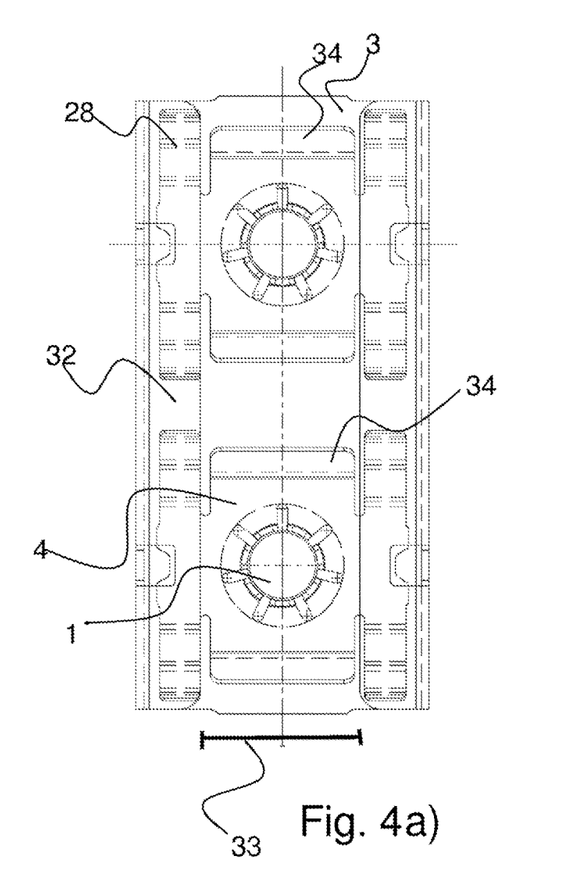
FIG. 4: shows a second embodiment of the invention.
Figure 4B:
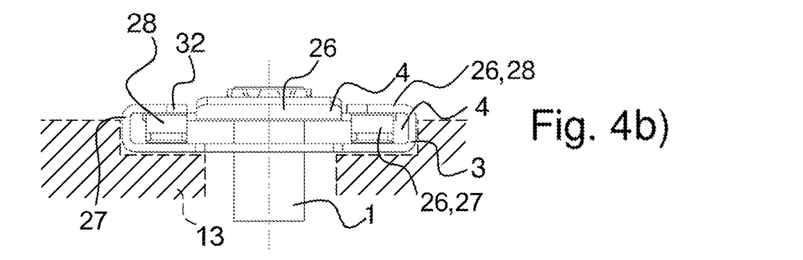
Figure 4C:
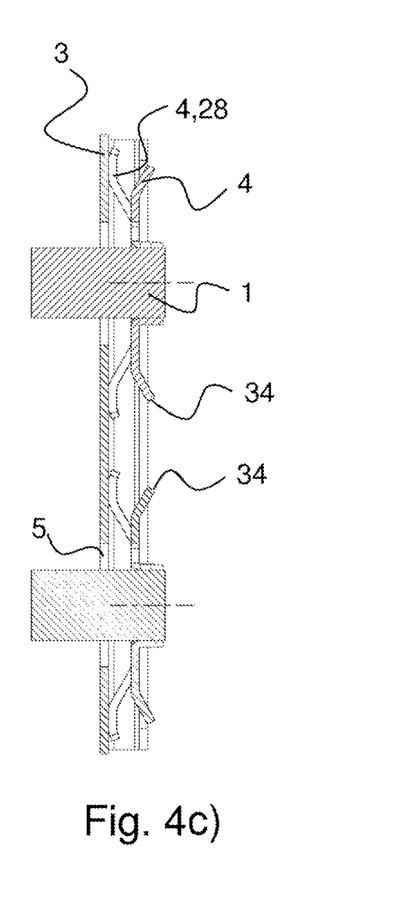

FIGS. 4*a-c* show a further embodiment of the invention in a bottom view (4*a*), in a side view (4*b*) and in a sectional side view 4*c*).

In this embodiment, the first guide arrangement 3 is configured as a U-shaped component in side view with folded-round ends 32 pointing inwards towards one another. An accommodation space for the second guide arrangement 4 is thus defined by the distance of these ends 32 from the main surface of the first guide arrangement (height 17) and by the width and length of the base surface of the first receptacle (base surface). Formed simultaneously in the region of the bent over sides is a wrap-around 27 which, as engagement means 26, engages around a correspondingly formed engagement means 26 of the second guide arrangement 4, namely a spring element 28. The distance between the two ends 32, directed towards one another, defines a channel 33 with a channel width. Formed corresponding to this channel width is an engagement means 26 of the second guide arrangement 4, namely bent-up ends 34 which are directed away from the first guide arrangement 3 and which project out of the plane in which the two ends 32 pointing towards one another are located. The width of these ends 34 is shorter than the channel width. This produces a displaceability of the second guide arrangement to the extent of the width difference, namely to the extent until the ends 34 meet the channel wall with their narrow sides. This is also shown in plan view 4*a*, according to which the width of the second guide arrangement 4 between two spring elements 28 is less than the width of the base surface of the first guide arrangement 3. A second displacement direction of the second guide arrangement 4 arises along the longitudinal axis of the first guide arrangement 3, so that in this embodiment as well, horizontal displaceability of the second guide arrangement in the first guide arrangement is possible in a plane in two directions, and a contact pin 1 passing through both means can therefore wobble relative to the first guide arrangement 3. In this embodiment, two second guide arrangement 4 are associated with one first guide arrangement 3, however according to the invention there can also be more than two, three or four, in particular also second guide arrangement 4 can be arranged in two or more rows if the first guide arrangement 3 provides corresponding engagement means 26. In principle, this applies to the first embodiment, in which the form of the first guide arrangement 3 is to be adapted accordingly and which would then accordingly also have more than one central opening 5. According to the invention, a plurality of central openings 12 can also be provided in the second guide arrangement 4. The result of this would be that the contact pins 1 passing through these openings could then only perform the same movement and not mutually independent wobbling movements. However, this may be desirable depending on the component 13 to be contacted and on the relative movements thereof during operation.

Thus, the invention allows a movement of the contact pin which compensates a movement of the contacted components when the position thereof is changed due to altered operating conditions based on a displaceability, allowed in a plane, of a second guide arrangement relative to a first guide arrangement fixed on the component. Here, provided on both guide arrangement are one or more engagement means which are precisely coordinated with one another in terms of construction and function and which, by engaging in one another, allow a secure contacting and preferably allow force-locking connections in addition to form-locking connections between the two guide arrangement.

What is claimed is:

1. A power contacting device comprising a contact pin (1) and at least one contact pin receptacle (2) penetrated by the contact pin in an operating state, the contact pin receptacle (2) having a first guide arrangement (3) fixed to a printed circuit board, a printed circuit board stack, a conductor rail, or other components carrying currents greater than 100 A in the operating state and a second guide arrangement (4) conductively connected to the first guide arrangement, the second guide arrangement (4) being arranged displaceably on the first guide arrangement (3) and the contact pin (1) conductively contacting at least the second guide arrangement (4) in the operating state,
    wherein the first guide arrangement (3) and the second guide arrangement (4) have mutually corresponding engagement means (16, 21; 26); and
    wherein the second guide arrangement (4) is displaceable with respect to the first guide arrangement (3) in the operating state in a plane intersecting the contact pin (1).

2. The device according to claim 1, wherein the first guide arrangement (3) and the second guide arrangement (4) each have a central opening (5, 12) through each of which the contact pin (1) passes in the operating state.

3. The device according to claim 1, wherein the engagement means (26) of the first guide arrangement (3) are configured as at least one radially outer opening.

4. The device according to claim 3, wherein the engagement means (26) of the second guide arrangement (4) are configured as engagement lugs (16) corresponding in number and shape to the number of radially outer openings (6) in the first guide arrangement (3).

5. The device according to claim 4, wherein the second guide arrangement (4) has a horizontal displaceable mobility in the first guide arrangement (3) with maximum displacements of the second guide arrangement (4) relative to the first guide arrangement (3) corresponding to a radial length difference between a radial extent (19) of the outer openings (6) and a radial width (20) of the engagement lugs (16).

6. The device according to claim 4, wherein the engagement lugs are arranged on the radially outer edge (15) of the second guide arrangement.

7. The device according to claim 3, wherein the engagement means (26) are three radially outer openings (6).

8. The device according to claim 3, wherein the engagement means (26) are configured as wrap-arounds (27).

9. The device according to claim 3, wherein the engagement means (26) are configured as beads.

10. The device according to claim 9, wherein the engagement means on the second guide element are configured as beads (21) which are formed and arranged correspondingly for engagement in the beads (8) of the first guide arrangement (3).

11. The device according to claim 3, wherein the engagement means (26) are equally spaced apart over a circumference of the first guide arrangement (3) and of the second guide arrangement (4).

12. The device according to claim 1, wherein the first guide arrangement (3) is configured as a circular disc (9) extending in a plane with an edge (10) at an angle to the plane.

13. The device according to claim 12, wherein the second guide arrangement (4) is configured as a circular disc, that is radially shorter compared to the first guide arrangement (3), a thickness of the circular disc being less than a height (17) of the edge (10) of the first guide arrangement (3).

14. The device according to claim 12, wherein the first guide arrangement further comprises a plurality of fastening tabs (11) which are directed radially outwards and are oriented predominantly in parallel with the plane of the circular disc (9).

15. The device according to claim 1, wherein the second guide arrangement (4) has a plurality of spring contact arms (14) which are directed towards a center (13) of the central opening (12), the second central opening (12) being smaller than the first central opening (5).

16. The device according to claim 1, wherein the engagement lugs (16) form a wrap-around (27) for the regions (7) of the first guide arrangement (3).

17. The device according to claim 1, wherein at least one of the first guide arrangement (3) and the second guide arrangement (4) is configured as a predominantly rectangular plate.

18. The device according to claim 1, wherein the engagement means (26) are configured as spring elements (28).

19. The device according to claim 1, wherein the engagement means on the second guide element are configured as beads (21) which are formed and arranged correspondingly for engagement in the beads (8) of the first guide arrangement (3).

* * * * *